(12) United States Patent
Barnhart et al.

(10) Patent No.: US 6,568,999 B2
(45) Date of Patent: May 27, 2003

(54) METHOD AND APPARATUS FOR CLEANING A SURFACE OF A MICROELECTRONIC SUBSTRATE

(75) Inventors: Gunnar A. Barnhart, Boise, ID (US); Eric K. Grieger, Boise, ID (US); Greg S. Green, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/974,343

(22) Filed: Oct. 9, 2001

(65) Prior Publication Data

US 2002/0028640 A1 Mar. 7, 2002

Related U.S. Application Data

(62) Division of application No. 09/369,232, filed on Aug. 5, 1999.

(51) Int. Cl.[7] .................... B24B 57/00; B08B 1/04; B08B 3/00; B08B 11/00
(52) U.S. Cl. .................... 451/65; 15/236.1; 15/97.1
(58) Field of Search .................... 451/65, 66, 67, 451/451, 268; 15/236.1, 230.1, 97.1, 102

(56) References Cited

U.S. PATENT DOCUMENTS

| | | | | |
|---|---|---|---|---|
| 5,144,711 A | * | 9/1992 | Gill, Jr. .................... | 15/97.1 |
| 5,806,126 A | * | 9/1998 | De Larios et al. ............ | 15/102 |
| 5,870,793 A | * | 2/1999 | Choffat et al. ................ | 15/102 |
| 6,196,901 B1 | * | 3/2001 | Minami ....................... | 451/63 |

FOREIGN PATENT DOCUMENTS

| | | | |
|---|---|---|---|
| JP | 361019559 | * | 1/1986 |
| JP | 362162467 | * | 7/1987 |

* cited by examiner

*Primary Examiner*—Robert A. Rose
(74) *Attorney, Agent, or Firm*—Dorsey & Whitney LLP

(57) ABSTRACT

A method and apparatus for cleaning a surface of a microelectronic substrate. In one embodiment, the apparatus can include a support member having a manifold in fluid communication with a source of liquid and in fluid communication with at least one exit aperture. A porous brush member can be coupled to the support member such that a contact portion of the brush is positioned against the exit aperture to receive liquid directly from the exit aperture. The liquid can flow from the exit aperture through the contact member and to the surface of the microelectronic substrate to keep the contact portion moist. The contact portion can be moistened as it cleans the microelectronic substrate or between cleaning cycles. The liquid can also be supplied to the contact portion at a rate sufficient to remove particulates and other contaminants from a porous outer surface of the contact portion.

33 Claims, 5 Drawing Sheets

METHOD AND APPARATUS FOR CLEANING A SURFACE OF A MICROELECTRONIC SUBSTRATE

CROSS-REFERENCE TO RELATED APPLICATION

This application is a divisional of pending U.S. patent application Ser. No. 09/369,232, filed Aug. 5, 1999.

TECHNICAL FIELD

The present invention is directed toward methods and apparatuses for cleaning the surface of a microelectronic substrate.

BACKGROUND OF THE INVENTION

During processing of substrates and substrate assemblies used to form microelectronic devices, the surfaces of the substrates and substrate assemblies can become contaminated with particulate matter. The contaminants must generally be removed to prevent interference with subsequent processing steps and/or to prevent improper formation or operation of the microelectronic devices. Accordingly, several conventional tools can rinse the surfaces of the microelectronic substrates between processing steps to remove the contaminants.

FIG. 1 is a partially schematic, front isometric view of a conventional apparatus 10 (such as a model AS-2000, available from Dai Nippon Screen of Hikone, Japan) having a substrate support 20 that supports a substrate 12 having an upper surface 14 and a lower surface 16 facing opposite the upper surface 14. The substrate support 20 can include a plurality of rollers 21, each having an outer surface 22 engaged with an outer rim 18 of the substrate 12. Each roller 21 is rotatable about a roller axis 23, as indicated by arrow A. As the rollers 21 rotate about the roller axes 23, they rotate the substrate 12 about a substrate rotation axis 13, as indicated by arrow B.

The apparatus 10 can further include two brush assemblies 30, one proximate to the upper surface 14 of the substrate 12 and the other proximate to the lower surface 16. Each brush assembly 30 overhangs the outer rim 18 of the substrate 12, and is intersected by the substrate rotation axis 13. Accordingly, the entire area of the upper and lower surfaces 14, 16 can contact the brush assemblies 30 as the substrate 12 rotates about the substrate rotation axis 13.

Each brush assembly 30 can include a brush support 40 having a first flange 41 secured to a second flange 42 with screws 46 to clamp a brush 50 therebetween. The brush 50 includes a flat, cross-shaped base 53 having four contact portions 51 projecting toward the substrate 12. Each contact portion 51 has a pair of edges 52 that bear against the substrate 12. The brush support 40 has a central opening 44 and the base 53 of the brush 50 has a base opening 55 aligned with the central opening 44.

Each brush support 40 is removably coupled to a chuck 80 which is in turn coupled to a drive mechanism 31 (shown schematically in FIG. 1) to rotate the brush support 40 about a brush rotation axis 33, as indicated by arrow C. Each brush support 40 is also coupled to a fluid supply conduit 32 (shown schematically in FIG. 1) which is in turn coupled to a source of cleaning liquid (not shown), such as de-ionized water. The fluid supply conduit 32 directs liquid through the base opening 55 in the base 53 and the central opening 44 of the brush support 40. The liquid passes through the central opening 44 directly to the surface of the substrate 12. When the liquid reaches the surface of the substrate 12, the rotational motion of the brushes 50 about the brush rotation axes 33 and the rotational motion of the substrate 12 about the substrate rotation axis 13 together distribute the liquid over the surfaces 14, 16 of the substrate 12. The liquid entrains contaminants on the substrate 12, and the contact portions 51 of the brushes 50 sweep the liquid and the entrained contaminants from the substrate 12.

One drawback with some conventional substrate cleaning devices of the type shown in FIG. 1 is that the devices may not uniformly distribute the cleaning liquid over the surfaces 14, 16 of the substrate 12. As a result, residual contaminants may remain on some portions of the substrate 12. The residual contaminants can interfere with subsequent substrate processing steps or with the operation of the microelectronic device formed on the substrate 12.

Another drawback is that the brushes 50 can dry out and damage the substrate 12. For example, if the cleaning liquid is not uniformly distributed over the surfaces 14, 16 of the substrate 12, portions of the brushes 50 can dry out. Alternatively, the brushes 50 can dry out between cleaning cycles. In either case, the dry brush portions can become rigid and/or abrasive and can scratch the substrate 12, potentially damaging the substrate 12.

Another drawback with the apparatus 10 shown in FIG. 1 is that the contact portions 51 of the brushes 50 may entrap the contaminants entrained by the liquid as the brushes 50 and the substrate 12 move relative to each other. The contact portions 51 can press the entrapped contaminants against the surfaces of the substrate 12 and scratch or otherwise damage the substrate 12.

Another conventional device, described in U.S. Pat. No. 5,729,856 to Jang et al., includes a bristle brush having a U-shaped crosssection to clean the edge of a semiconductor wafer mounted on a chuck. A rinsing solution is injected through spaces in the body of the brush to flow along the bristles toward the wafer. One drawback with this device is that it does not clean the entire surface of the wafer, but rather cleans only the edge of the wafer. A further drawback is that the chuck engages the center of the wafer so that the center is not accessible to the brush for cleaning.

Still another conventional device, described in U.S. Pat. No. 5,858,109 to Hymes et al., and U.S. Pat. No. 5,806,126 to de Larios et al., includes an elongated roller brush that rotates about an axis perpendicular to the axis about which the semiconductor wafer rotates. Liquid is supplied to a hollow core of the brush and is then distributed through slots or holes to the brush itself. One drawback with devices of this type is that the elongated roller brush can be relatively large and therefore expensive to manufacture. A further drawback is that it can be difficult to supply the liquid to the brush at a high flow rate because the liquid may leak from the interface between the core and the brush. Furthermore, at high liquid pressures, the liquid may be more likely to pass through portions of the brush that do not contact the wafer rather than those that do contact the wafer because the brush portions that do not contact the wafer have a low fluid flow resistance. Accordingly, the fluid may not be delivered to the wafer at the point of contact between the wafer and the brush, reducing the cleaning effectiveness of the brush.

SUMMARY OF THE INVENTION

The present invention is directed to methods and apparatuses for treating one or more surfaces of a microelectronic substrate as the substrate rotates about a substrate axis. The apparatus can include a support member having an entrance port coupled to a source of liquid and in fluid communication with at least one exit aperture. The apparatus can further include an engagement element, such as a porous pad, coupled to the support member and having at least one contact portion positioned against the exit aperture of the support member to receive liquid directly from the exit aperture. The support member and the engagement element are positionable relative to the microelectronic substrate in a contact position with the contact portion against the surface of the microelectronic substrate as the microelectronic substrate rotates relative to the support member.

In one aspect of the invention, the support member can be rotatable about a support member axis generally parallel to the substrate axis, and can include a manifold in fluid communication with the entrance port and coupled to a channel extending radially away from the support member axis. A first region of the contact portion of the engagement element can be aligned with the channel and a second region, positioned radially outwardly from the first region, can be spaced apart from the channel. Accordingly, the liquid can pass from the manifold, through the channel, into the first region of the contact portion, through the contact portion to the second region, and outwardly to the substrate surface.

In another aspect of the invention, the engagement element and support member can form part of an assembly for both cleaning and planarizing the microelectronic substrate. The assembly can also include a carrier configured to support the microelectronic substrate and a polishing pad proximate to the carrier. The polishing pad can have a planarizing surface configured to press against the microelectronic substrate and at least one of the polishing pad and the carrier can be movable relative to the other to remove material from the microelectronic substrate.

In a method in accordance with an aspect of the invention, at least one contact portion of an engagement element is pressed against the surface of the microelectronic substrate and the microelectronic substrate is rotated about a substrate axis. Liquid is supplied through pores of the contact portion to the surface of the microelectronic substrate. The liquid can be supplied at a rate sufficient to remove particulates and other contaminants from an outer surface of the contact portion and/or the liquid can be supplied to the contact portion after the contact portion has been disengaged from the microelectronic substrate to keep the contact portion moist. The contact portion can be rotated relative to the microelectronic substrate about an axis generally parallel to the substrate axis.

DETAILED DESCRIPTION OF THE INVENTION

The present invention is directed toward methods and apparatuses for cleaning and otherwise treating the surfaces of microelectronic substrates and/or substrate assemblies. Many specific details of certain embodiments of the invention are set forth in the following description and in FIGS. 2–6 to provide a thorough understanding of such embodiments. One skilled in the art, however, will understand that the present invention may have additional embodiments, or that the invention may be practiced without several of the details described in the following description.

Figure 2:
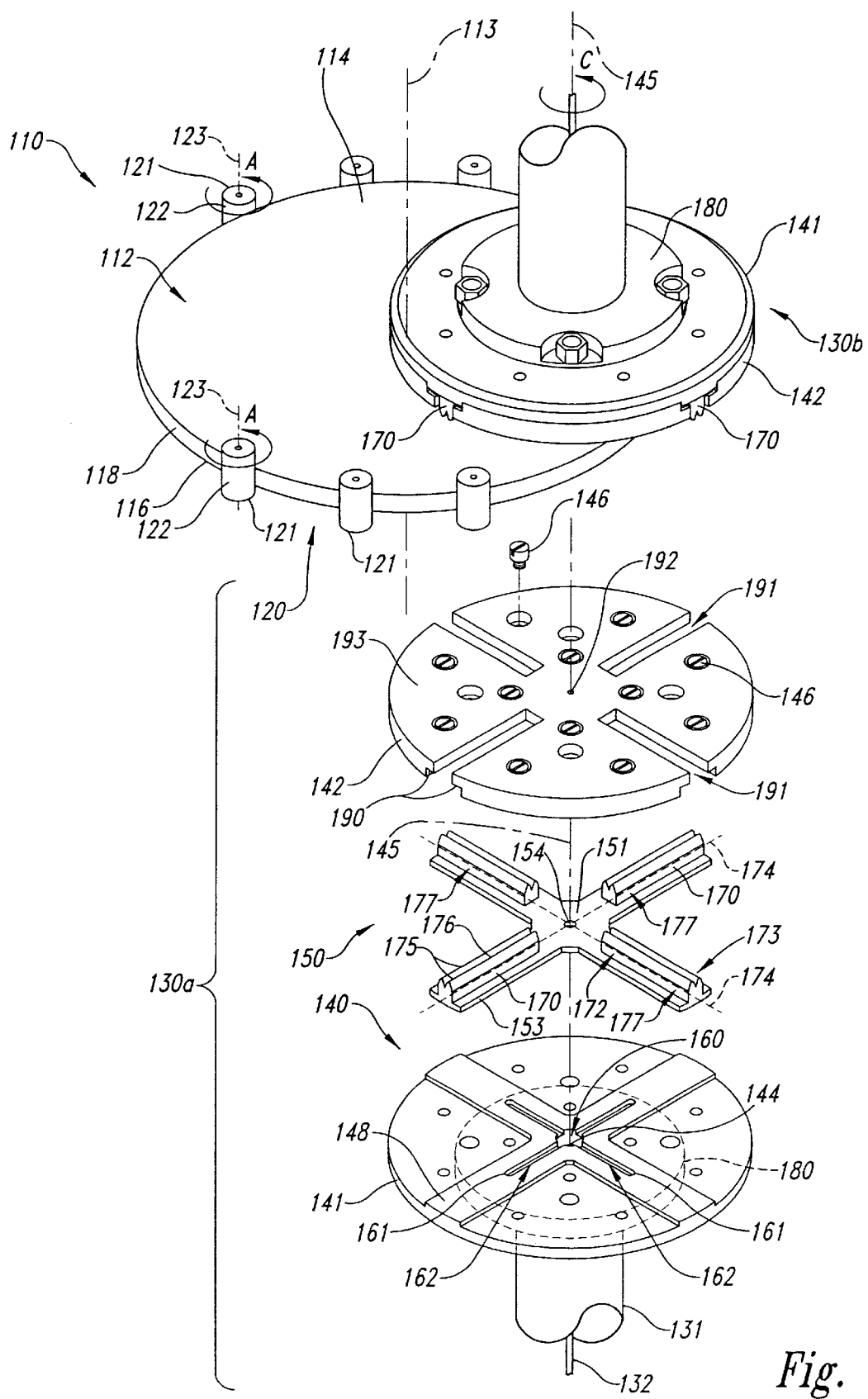
FIG. 2 is an exploded front isometric view of a cleaning device having a brush and a brush support in accordance with an embodiment of the invention.

FIG. 2 is a partially exploded side isometric view of an apparatus 110 having a substrate holder 120 and two brush assemblies 130 (shown as a lower brush assembly 130a and an upper brush assembly 130b) in accordance with an embodiment of the invention. The substrate holder 120 can include a plurality of rollers 121, each having an outer surface 122 that engages an outer rim 118 of a microelectronic substrate 112. The rollers 121 rotate the microelectronic substrate 112 about a substrate axis 113 when the rollers 121 rotate about roller axes 123 in a manner generally similar to that discussed above. The lower brush assembly 130a is positioned proximate to a lower surface 116 of the substrate 112 and the upper brush assembly 130b is positioned proximate to an upper surface 114 of the substrate 112 to clean or otherwise treat the substrate surfaces. For purposes of illustration, the lower brush assembly 130a is shown in an exploded view in FIG. 2. It will be understood that the following discussion of the lower brush assembly 130a also applies generally to the upper brush assembly 130b.

The lower brush assembly 130a can include a brush support 140 that supports an engagement element, such as a brush member 150, relative to the substrate 112. In one embodiment, the brush support 140 can include a first flange 141 removably coupled to a second flange 142. The brush member 150 is clamped between the first and second flanges 141 and 142. The flanges 141/142 can be coupled to each other with threaded fasteners 146 or other suitable devices.

The first flange 141 can be coupled to a chuck 180, which is in turn coupled to a drive mechanism 131 (shown schematically in FIG. 2) to rotate the support member 140 and the brush member 150 about a support member axis 145. The drive mechanism 131 can also move the support member 140 and the brush member 150 toward the substrate 112 to engage the brush member 150 with the lower surface 116, and away from the substrate 112 to disengage the brush member 150 from the lower surface 116.

The first flange 141 can include an entrance port 144 in fluid communication with a liquid supply conduit 132 that extends through the chuck 180 and the drive mechanism 131 to a source of liquid (not shown). In one embodiment, the liquid supply conduit 132 can be coupled to a source of deionized water. In other embodiments, the liquid supply conduit 132 can be coupled to sources of other liquids, such as tetramethyl ammonium hydroxide, hydrogen fluoride, or other liquids used for cleaning or otherwise treating the microelectronic substrate 112.

The first flange 141 can have an upwardly facing support surface 148 to support the brush member 150 and a cylindrical manifold 160 extending through the support surface 148 to the entrance port 144. In one embodiment, the manifold 160 can be coupled to four slots or channels 161 extending radially outwardly from the manifold 160. Each channel 161 can have an upwardly facing exit aperture 162.

In the embodiment shown in FIG. 2, each exit aperture 162 extends for the entire length of the corresponding channel 161. In other embodiments, the exit apertures can have other configurations, as will be discussed in greater detail below with reference to FIG. 6. In any case, the exit apertures 162 allow the liquid to flow from the manifold 160 to the brush member 150.

The brush member 150 can be a unitary pad of generally porous foam or other material through which the liquid can pass. For example, the brush member 150 can be a pad of a porous polyvinyl alcohol that is milled, molded or otherwise formed into a selected shape. Alternatively, the brush member 150 can be a plurality of bristles projecting from a base. The brush member 150 can also include a central connecting portion 151 having a pass-through aperture 154 sized to allow a portion of the liquid to pass directly from the manifold 160 through the connecting portion 151 to the substrate 112. The pass-through aperture 154 is also a flow restrictor that forces the remaining liquid to pass through the pores of the brush member 150. Alternatively, the aperture 154 can be eliminated so that all the liquid passes through the brush member 150.

The brush member 150 can also have four contact portions 170 projecting from the central portion 151 to contact the microelectronic substrate 112. In one embodiment, each contact portion 170 is elongated along a contact portion axis 174 extending radially outwardly from and generally perpendicular to the support member axis 145. Each contact portion 170 can have a generally flat, radially extending base portion 153 positioned against one of the channels 161. Each contact portion 170 can further include two edges 175, also elongated along the contact portion axis 174 and separated by a groove 176. The edges 175 of the contact portions 170 are generally co-planar so that each contact portion 170 engages the flat lower surface 116 of the substrate 112 to sweep liquid and contaminants from the lower surfaces 116.

In one embodiment, each contact portion 170 can include an inner region 172 positioned toward the support member axis 145 and an outer region 173 positioned radially outwardly from the inner region 172. In a further aspect of this embodiment, the inner region 172 can be aligned with the corresponding channel 161 of the first flange 141, and the outer region 173 can be positioned radially outwardly beyond the channel 161. Accordingly, pressurized liquid can flow from the channel 161 into the inner region 172 of the contact portion 170, then radially outwardly to the outer region 173 of the contact portion 170. This is unlike some conventional devices which provide all the liquid directly to the surfaces of the substrate 112 adjacent to the contact portions 170, rather than forcing at least some of the liquid through the contact portions 170.

The contact portions 170 are held in a fixed position relative to the first flange 141 by the second flange 142, which clamps the base portions 153 of brush member 150 against the support surface 148 of first flange 141. The second flange 142, for example, can have contact surfaces 190 that press against the brush member 150 and a facing surface 193 facing opposite the contact surfaces 190 toward the substrate 112. The facing surface 193 can include four radially extending brush openings 191 aligned with the contact portions 170 of the brush member 150. The brush openings 191 can be sized and positioned to allow the contact portions 170 to project beyond the facing surface 193 to contact the substrate 112.

Figure 1:
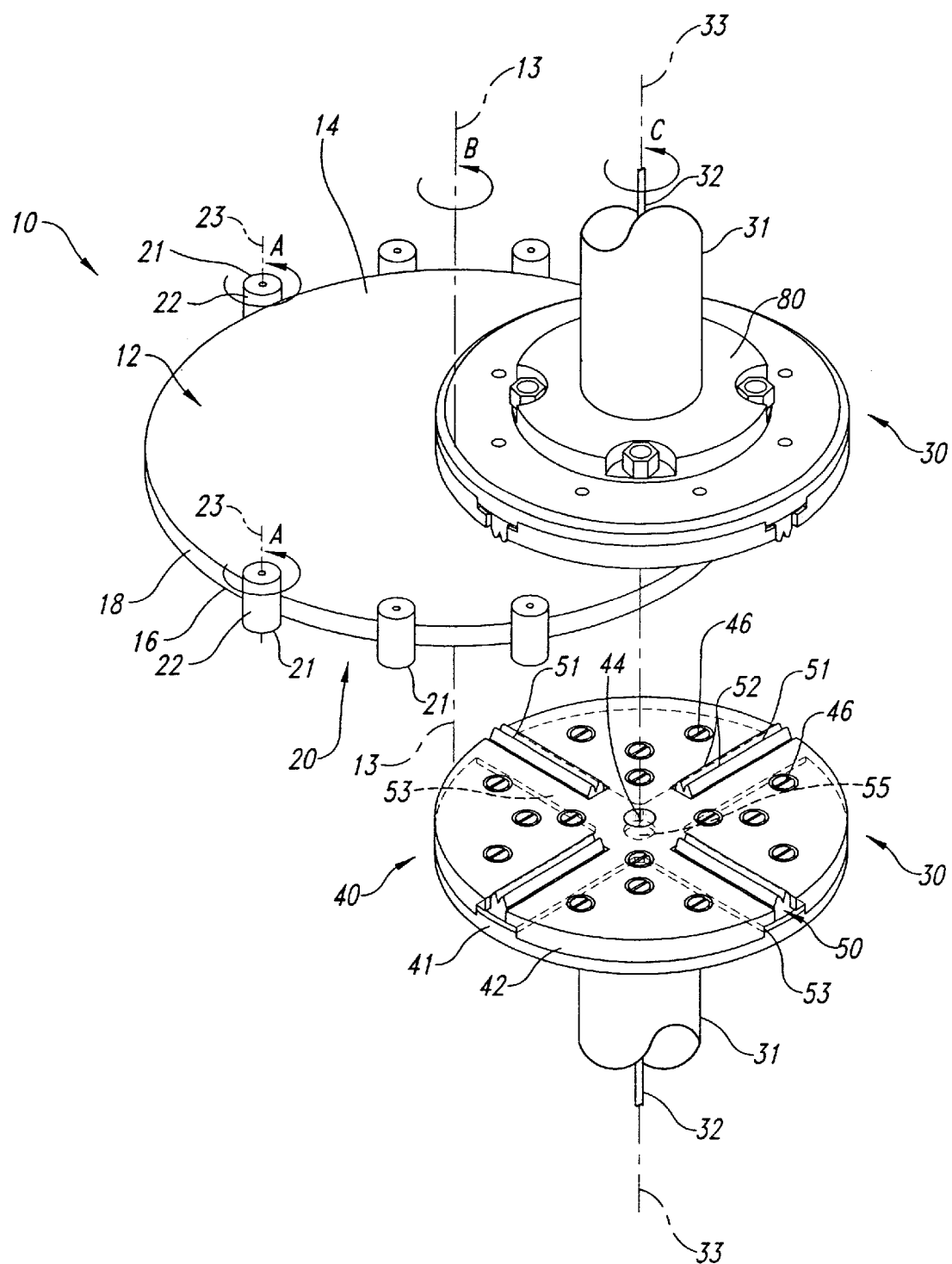
FIG. 1 is a partially schematic, front isometric view of a substrate cleaning device in accordance with the prior art.

In one embodiment, the second flange 142 can have a direct exit aperture 192 in the facing surface 193 and aligned with the pass-through aperture 154 of the brush member 150 and with the manifold 160 of the first flange 141. Accordingly, some of the liquid from the manifold 160 can pass directly through the pass-through aperture 154 and the direct exit aperture 192 to the substrate 112. In one aspect of this embodiment, the direct exit aperture 192 can be substantially smaller than the central opening 44 (shown in FIG. 1) to restrict the fluid flow directly through the brush holder 140 and force at least some of the fluid into the channels 161 and through the contact portions 170 of the brush 150. For example, the direct exit aperture 192 can have a diameter about 20% as large as the diameter of the central opening 44. Alternatively, the pass-through aperture 154 and the direct exit aperture 192 can be eliminated, so that all the liquid passes through the channels 161 and the contact portions 170 of the brush member 150.

In operation, the substrate 112 is positioned between the rollers 121 of the substrate holder 120 to rotate about the substrate axis 113 as the rollers 121 rotate about the roller axes 123. The chucks 180 move the brush assemblies 130 toward the upper and lower surfaces 114/116 of the substrate 112 until the contact portions 170 of each brush assembly 130 engage the surfaces 114/116 of the substrate 112. Each brush assembly 130 rotates about the corresponding support member axis 145 to sweep the contact portions 170 over the substrate 112. Alternatively, the brush assemblies 130 can remain stationery as the substrate 112 rotates about the substrates axis 113. In one aspect of the operation, the direction of rotation of the brush assemblies 130 can reverse part way through a cleaning cycle. Alternatively, the rotation direction of the brush assemblies 130 can be maintained throughout the cycle. While the contact portions 170 contact the substrate 112, liquid passes through the manifolds 160 of each brush assembly 130, the channels 161 of each first flange 141, and the contact portions 170 of each brush 150 to the surfaces of the substrate 112. As the substrate 112 and the brush assemblies 130 rotate relative to each other, the relative motion distributes the liquid over the surfaces 114/116 of the substrate 112 to entrain particulates and/or contaminants from the surface of the substrate 112 in the liquid. The contact portions 170 then sweep the fluid with entrained particulates and/or contaminants from the surfaces 114/116 of the substrate 112. Once the cleaning cycle is complete, the chucks 180 move to disengage the brush assemblies 130 from the substrate 112, and then the substrate 112 can be removed from the rollers 121.

In a further aspect of the operation of the apparatus 110, the liquid can be supplied to the brush assemblies 130 at a rate and pressure sufficient to force particulates and/or contaminants away from outer surfaces 177 of the contact portions 170. For example, in one embodiment, the liquid can be supplied to each brush assembly 130 at a rate of from 0.5 liters per minute to 1.5 liters per minute and a pressure of approximately 30 psi. In still a further aspect of this embodiment, the total cross-sectional area of four contact portions 170 (when intersected by a plane perpendicular to the support member axis 145 and axially positioned along the support member axis 145 between the base portion 153 and the groove 176 of the brush member 150) can be approximately 14 cm. Accordingly, the liquid flow rate per unit cross-sectional area of the contact portions 170 can be in the range of from approximately 0.036 liters per square centimeter per minute to approximately 0.107 liters per square centimeter per minute.

In a method of operation in accordance with another embodiment of the invention, the liquid can be pumped through the brush assemblies 130 at a reduced rate (for example, between cleaning cycles when the brush assemblies 130 are not in contact with a substrate 112) to keep the contact portions 170 moist. In one aspect of this operation, liquid can be pumped through the brush assemblies 130 at a rate of from approximately 0.5 liters per minute to approximately 1.5 liters per minute, for a limited duration of approximately 10 seconds. This operation can be repeated approximately every 15 minutes to keep the contact portions 170 moist. Alternatively, the liquid can be pumped at lower flow rates for longer periods of time (or at higher flow rates for shorter periods of time), so long as the contact portions 170 remain moist.

One feature of an embodiment of the apparatus 110 discussed above is that the channels 161 force at least some of the liquid to pass through the contact portions 170 before the liquid reaches the surface of the substrate 112. The liquid, for example, can be injected into the contact portions 170 between cleaning cycles at intermittent periods or a reduced rate to keep the contact portions 170 moist when the contact portions 170 are not adjacent the substrate 112. An advantage of this feature is that it reduces the likelihood that the contact portions 170 will scratch the substrate 112 because the contact portion 170 remains moist during and/or between cleaning cycles.

A further advantage of an embodiment of the apparatus 110 is that the liquid can flow through the contact portions 170 at a rate and pressure sufficient to flush particles and/or contaminants from the outer surface 177 of the contact portions 170. Accordingly, the contact portions 170 can be less likely to drag such particulates or contaminants across the surfaces of the substrate, further reducing the likelihood for scratching the surfaces of the substrate 112.

Figure 3:
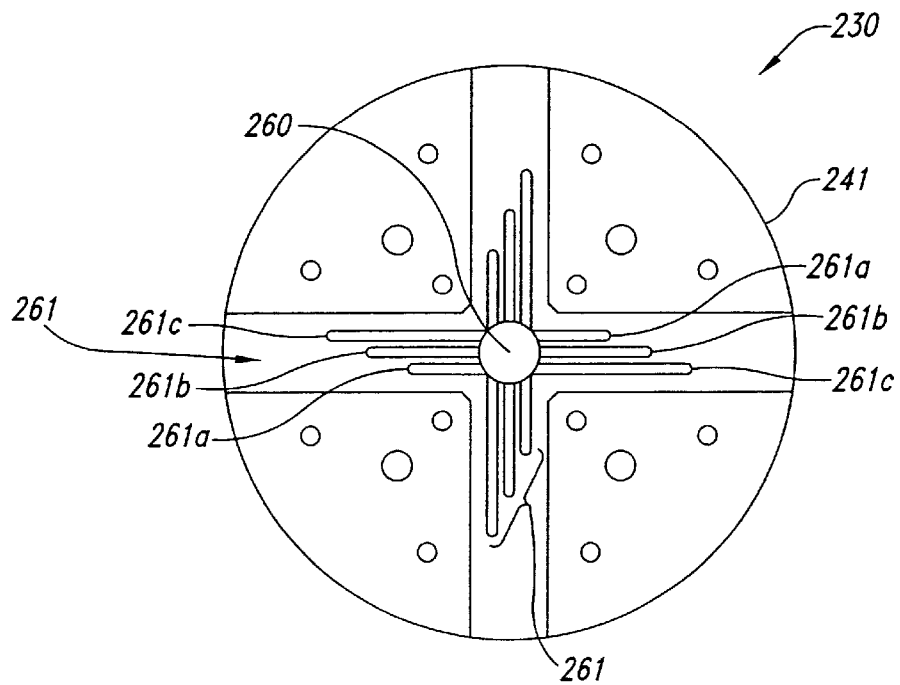
FIG. 3 is a top plan view of a portion of a brush assembly having a support flange in accordance with another embodiment of the invention.

FIG. 3 is a top plan view of a portion of a brush assembly 230 having a first flange 241 in accordance with another embodiment of the invention. The first flange 241 can support a brush member similar to the brush member 150 discussed above with reference to FIG. 2. As shown in FIG. 3, the first flange 241 can include a manifold 260 coupled to four groups of channels 261. Each group of channels 261 can include a relatively short channel 261a, an intermediate channel 261b, and a longer channel 261c. The short channel 261a can be aligned with the inner region 172 (FIG. 2) of the contact portion 170 (FIG. 2) of the brush member 150. The longer channel 261c can be aligned with the outer region 173 (FIG. 2) of the contact portion 170, and the intermediate channel 261b can be aligned with an intermediate region between the inner region 172 and the outer region 173. Accordingly, the channels 261a–261c can supply liquid directly to different regions of the contact portion 170.

Figure 4:
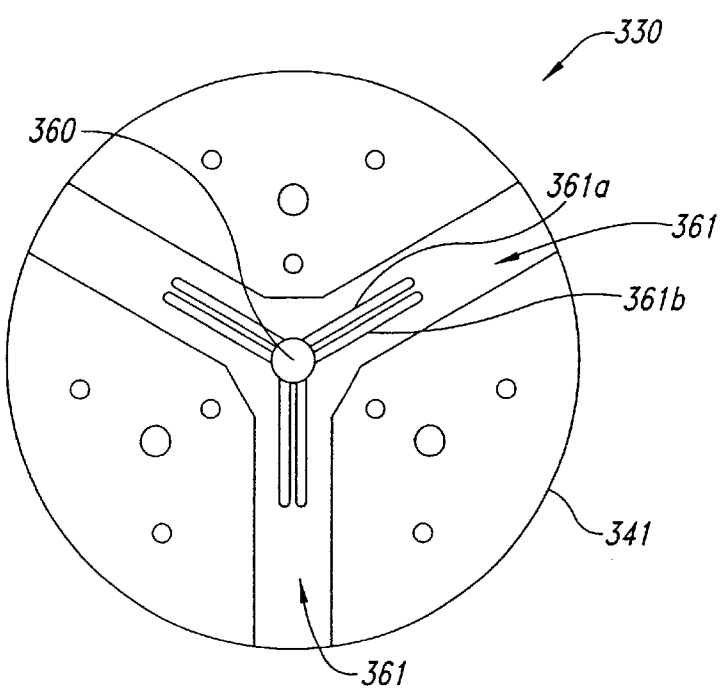
FIG. 4 is a top plan view of a portion of a brush assembly having a support flange in accordance with yet another embodiment of the invention.

FIG. 4 is a top plan view of a portion of a brush assembly 330 having a first flange 341 that includes a manifold 360 and three sets of channels 361 in accordance with another embodiment of the invention. Each set of channels can include adjacent channels 361a and 361b having equal lengths (as shown in FIG. 4) or having different lengths (as was discussed above with reference to FIG. 3). A brush member (not shown) generally similar to the brush member 150 discussed above with reference to FIG. 2, but having three contact portions 170, can be positioned adjacent the first flange 341 such that each contact portion 170 is aligned with a corresponding set of channels 361. In other embodiments, the first flange 341 and the corresponding brush member can have fewer channels and contact portions, respectively, so long as they effectively distribute liquid over the surfaces of the substrate 112 (FIG. 2).

Figure 5:
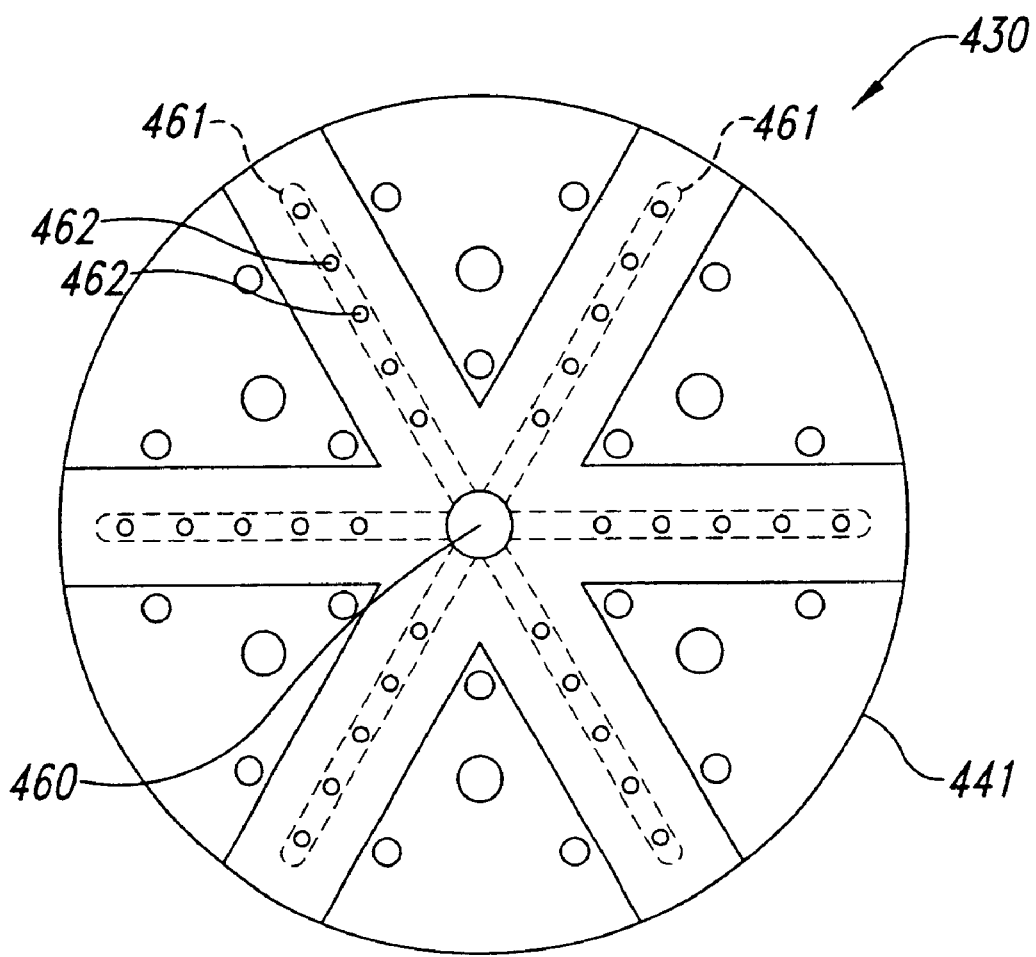
FIG. 5 is a top plan view of a portion of a brush assembly having a support flange in accordance with still another embodiment of the invention.

FIG. 5 is a top plan view of a portion of a brush assembly 430 having a first flange 441 that includes a manifold 460 coupled to six channels 461 in accordance with another embodiment of the invention. A brush member (not shown) generally similar to the brush member 150 discussed above with reference to FIG. 2, but having six contact portions similar to the contact portions 170 of the brush member 150 can be positioned adjacent the first flange 441 such that each contact portion is aligned with one of the channels 461. Each channel 461 can include a plurality of exit apertures 462 extending through a wall of the channel 461 directly to the contact portion to provide the liquid to the contact portion in a manner generally similar to that discussed above with reference to FIGS. 2–4.

Figure 6:
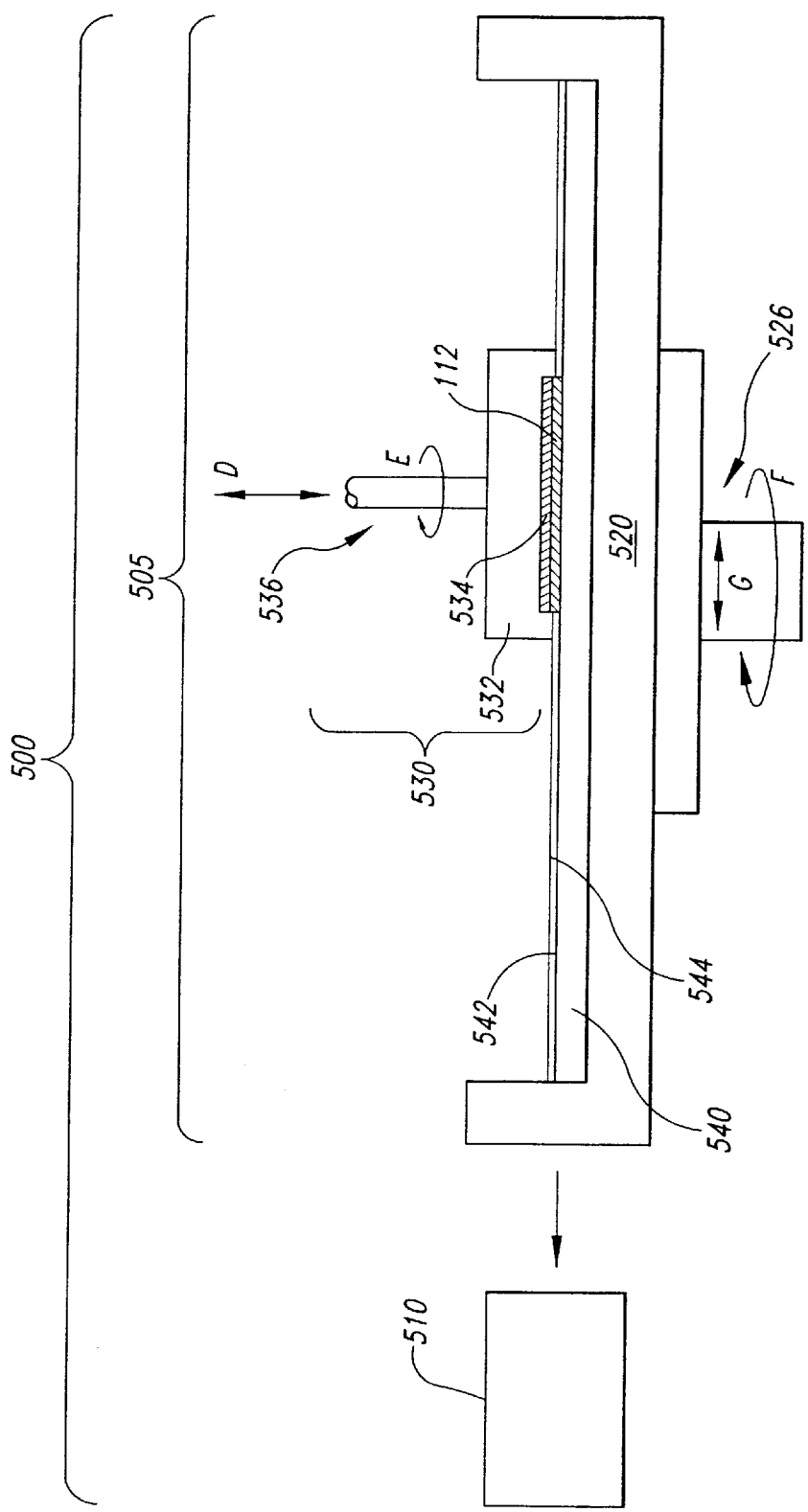
FIG. 6 is a partially schematic side elevational view of an apparatus having a planarizing machine and a brush assembly in accordance with another embodiment of the invention.

Embodiments of the methods and apparatuses discussed above with reference to FIGS. 2–5 can be used to clean the surfaces of the microelectronic substrate 112 before and/or after the substrate 112 undergoes chemical or chemical-mechanical planarizing processes (collectively "CMP"). CMP processes are used to create a highly planar surface at a precise elevation on the microelectronic substrate 112. For example, FIG. 6 is a partially schematic view of a manufacturing assembly 500 for planarizing and cleaning the substrate 112. The assembly 500 can include a cleaning apparatus 510 (shown schematically in FIG. 6), generally similar to the cleaning devices discussed above with reference to FIGS. 2–5 and positioned adjacent a CMP machine 505. A transfer arm (not shown) can transfer the substrate 112 to the cleaning apparatus 510 from the CMP machine 505.

The CMP machine 510 has a platen 520, a substrate carrier assembly 530 above the platen 520, and a polishing pad 540 between the platen 520 and the carrier assembly 530. The carrier assembly 530 generally includes a head 532 to pick up, hold and release the substrate 112 at the appropriate stages of the planarizing process. The carrier assembly 530 can also include a backing pad 534 to support the back side of the substrate 112. The head 532 may be a weighted, free-floating unit, or the carrier assembly 530 can include an actuator 536 attached to the head 532 to impart axial and/or rotational motion (indicated by arrows D and E, respectively). An actuator 526 coupled to the platen 520 can impart a rotational and/or translational motion (indicated by arrows F and G, respectively) to the platen 520.

The polishing pad 540 can be a non-abrasive polymeric pad (e.g., polyurethane), or it might be a fixed-abrasive polishing pad in which abrasive particles are fixedly dispersed in a resin or in another type of suspension medium. A planarizing fluid 544 covers the polishing pad 540 during planarization of the substrate assembly 112. The planarizing fluid 544 may be a conventional CMP slurry with abrasive particles that etch and/or oxidize the surface of the substrate 112, or the planarizing fluid 544 may be a "clean" non-abrasive planarizing solution without abrasive particles. In most CMP applications, abrasive slurries with abrasive particles are used on non-abrasive polishing pads and non-abrasive cleaning solutions without abrasive particles are used on fixed-abrasive polishing pads.

To planarize the substrate 112 with the CMP machine 505, the carrier assembly 530 presses the substrate 112 face-downward against a planarizing surface 542 of the polishing pad 540. At least one of the platen 520 or the head 532 moves relative to the other to move the substrate 112 across the planarizing surface 542 in the presence of the planarizing solution 544. As the face of the substrate 112 moves across the planarizing surface 542, the polishing pad 540 and/or the planarizing solution 544 continually remove material from the face of the substrate 112. Before and/or after the material is removed from the substrate 112, the substrate 112 can be moved to the cleaning apparatus 510 to be cleaned in a manner generally similar to the methods discussed above with reference to FIGS. 2–5.

From the foregoing it will be appreciated that, although specific embodiments of the invention have been described herein for purposes of illustration, various modifications may be made without deviating from the spirit and scope of the invention. For example, the methods and apparatuses discussed above with reference to FIGS. 2–6 can clean microelectronic substrates before or after processes other than CMP processes, and can be used for purposes other than cleaning, such as distributing non-cleaning liquids over the surfaces of the substrates. Accordingly, the invention is not limited except as by the appended claims.

What is claimed is:

1. A method for treating a surface of a microelectronic substrate, comprising:

clamping at least one contact portion of an engagement element between first and second flanges of a support member to support the at least one contact portion relative to the microelectronic substrate;

pressing the at least one contact portion of the engagement element against the surface of the microelectronic substrate;

rotating at least one of the microelectronic substrate about a first axis and the at least one contact portion about a second axis generally parallel to the first axis while the at least one contact portion presses against the surface of the microelectronic substrate; and supplying a liquid through the at least one contact portion to the surface of the microelectronic substrate.

2. The method of claim 1 wherein the engagement element includes a pad of porous polyvinyl alcohol and supplying the liquid includes passing the liquid through the pores of the polyvinyl alcohol.

3. The method of claim 1 wherein the at least one contact portion is one of a plurality of generally co-planar contact portions, further wherein pressing the at least one contact portion includes simultaneously pressing the plurality of contact portions against the surface of the microelectronic substrate.

4. The method of claim 1 wherein supplying the liquid includes driving the liquid through a manifold of a support member supporting the brush relative to the microelectronic substrate.

5. The method of claim 1 wherein the at least one contact portion of the engagement element is elongated along a third axis extending generally perpendicular to the second axis, further wherein supplying the liquid includes driving the liquid to a first region of the at least one contact portion spaced a first distance from the second axis, through the at least one contact portion to a second region of the at least one contact portion positioned radially outwardly from the first region along the third axis.

6. The method of claim 1 wherein supplying a liquid includes forcing particulates away from an outer surface of the at least one contact portion by passing the liquid outwardly through pores at the outer surface of the engagement element.

7. The method of claim 1, further comprising supporting the at least one contact portion of the engagement element with a support member and rotating the at least one contact portion about the second axis.

8. The method of claim 1, further comprising supplying fluid directly to the surface of the microelectronic substrate proximate to the at least one contact portion of the engagement element.

9. The method of claim 1 wherein pressing the at least one contact portion includes pressing a plurality of spaced apart edges of the at least one contact portion against the microelectronic substrate, each edge being spaced apart from a neighboring edge to define a channel between the edges.

10. The method of claim 1 wherein supplying a liquid includes forcing de-ionized water through the brush member.

11. The method of claim 1 wherein the surface of the microelectronic substrate is a first surface, the microelectronic substrate having a second surface facing opposite the first surface, the at least one contact portion being a first contact portion, the method further comprising:

pressing a second contact portion against the second surface of the microelectronic substrate; and supplying the liquid through the second contact portion to the second surface of the microelectronic substrate.

12. The method of claim 1 wherein supplying the liquid includes pumping the liquid through the contact portion at a flow rate of approximately 0.5 to approximately 1.5 liters per minute.

13. The method of claim 1 wherein supplying the liquid includes pumping the liquid at a pressure of approximately 30 psi.

14. The method of claim 1 wherein the at least one contact portion has a brush cross-sectional area in a plane generally perpendicular to the second axis, further wherein supplying the liquid includes pumping the liquid at a flow rate of approximately 0.036 to approximately 0.107 liters per minute per square centimeter of brush cross-sectional area.

15. The method of claim 1 wherein pressing the at least one contact portion against the surface of the microelectronic substrate and supplying a liquid to the surface of the microelectronic substrate result in cleaning the surface of the microelectronic substrate.

16. A method for treating a surface of a microelectronic substrate, comprising:

clamping a porous brush between first and second flanges of a support member to support the porous brush relative to the microelectronic substrate;

pressing the porous brush against a surface of the microelectronic substrate while moving at least one of the brush and the microelectronic substrate relative to the other;

disengaging the brush from the microelectronic substrate; and supplying a liquid through pores of the brush after disengaging the brush from the microelectronic substrate to maintain a selected level of liquid in the pores of the brush while the brush is disengaged from the microelectronic substrate.

17. The method of claim 16 wherein supplying the liquid includes pumping the liquid at a rate of approximately 0.5 to approximately 1.5 liters per minute for approximately 10 seconds.

18. The method of claim 16 wherein the brush has a brush cross-sectional area in a plane generally parallel to the surface of the microelectronic substrate, further wherein supplying the liquid includes pumping approximately 0.036 to approximately 0.107 liters per minute per square centimeter of brush cross-sectional area for approximately 10 seconds.

19. The method of claim 16 wherein the brush comprises a pad of porous polyvinyl alcohol and supplying the liquid includes pumping the liquid through the pores of the polyvinyl alcohol.

20. The method of claim 16 wherein the microelectronic substrate is rotatable about a first axis, the brush is rotatable about a second axis generally parallel to the first axis, and the brush includes a contact portion elongated along a third axis extending generally perpendicular to the second axis, further wherein supplying the liquid includes pumping the liquid to a first region of the contact portion spaced a first distance from the second axis, through the contact portion to a second region of the contact portion positioned radially outwardly from the first region along the third axis.

21. The method of claim 16 wherein supplying a liquid includes forcing particulates away from an outer surface of the brush by passing fluid through pores at the outer surface of the brush.

22. The method of claim 16 wherein supplying a liquid includes pumping de-ionized water through the brush.

23. The method of claim 16 wherein the brush is a first brush and the surface of the microelectronic substrate is a first surface, the microelectronic substrate having a second surface facing opposite the first surface, the method further comprising:

pressing a second porous brush against the second surface of the microelectronic substrate while moving at least one of the second brush and the microelectronic substrate relative to the other;

disengaging the second brush from the microelectronic substrate; and supplying a liquid through pores of the second brush after disengaging the second brush from the microelectronic substrate to maintain a selected level of liquid in the pores of the second brush while the second brush is disengaged from the microelectronic substrate.

24. A method for treating a surface of a microelectronic substrate, comprising:

clamping at least one contact portion of an engagement element between first and second flanges of a support member to support at least one contact portion of a brush relative to the microelectronic substrate;

pressing the at least one contact portion of the brush against the surface of the microelectronic substrate;

rotating the microelectronic substrate about a first axis;

rotating the contact portion about a second axis generally parallel to the first axis while the at least one contact portion presses against the surface of the microelectronic substrate; and removing material from an outer surface of the contact portion by forcing a liquid outwardly toward the surface of the microelectronic substrate through pores on the outer surface of the at least one contact portion.

25. The method of claim 24 wherein the brush comprises a pad of a porous polyvinyl alcohol and forcing the liquid includes forcing the liquid through the pores of the polyvinyl alcohol.

26. The method of claim 24 wherein forcing the liquid includes driving the liquid through a manifold of a support member supporting the brush relative to the microelectronic substrate.

27. The method of claim 24, further comprising forcing fluid directly to the surface of the microelectronic substrate proximate to the at least one contact portion of the brush.

28. The method of claim 24 wherein pressing the at least one contact portion includes pressing a plurality of spaced apart edges of the at least one contact portion against the microelectronic substrate, each edge being spaced apart from a neighboring edge to define a channel between the edges.

29. The method of claim 24 wherein forcing a liquid includes pumping de-ionized water.

30. The method of claim 24 wherein the surface of the at least one contact portion is a first contact portion, the microelectronic substrate is a first surface, the microelectronic substrate having a second surface facing opposite the first surface, the method further comprising:

pressing a second contact portion against the second surface of the microelectronic substrate;

rotating the second contact portion about an axis generally parallel to the first and second axes while the second contact portion is pressed against the second surface of the microelectronic substrate; and removing material from an outer surface of the second contact portion by forcing a liquid outwardly toward the surface of the microelectronic substrate through pores on the outer surface of the second contact portion.

31. The method of claim 24 wherein removing material includes supplying the liquid at a rate of approximately 0.5 to approximately 1.5 liters per minute.

32. The method of claim 24 wherein removing material includes supplying the liquid at a pressure of approximately 30 psi.

33. The method of claim 24 wherein the at least one contact portion of the brush has a brush cross-sectional area in a plane generally perpendicular to the second axis, further wherein forcing the liquid includes driving between approximately 0.036 to approximately 0.107 liters of liquid per minute per square centimeter of brush cross-sectional area.

* * * * *

UNITED STATES PATENT AND TRADEMARK OFFICE
CERTIFICATE OF CORRECTION

PATENT NO. : 6,568,999 B2
DATED : May 27, 2003
INVENTOR(S) : Gunnar A. Barnhart, Eric K. Grieger and Greg S. Green It is certified that error appears in the above-identified patent and that said Letters Patent is hereby corrected as shown below:

Column 2,
Line 35, "U-shaped crosssection" should read -- U-shaped cross-section --

Column 6,
Line 27, "remain stationery" should read -- remain stationary --
Line 60, "14 cm." should read -- 14 $cm^2$. --

Signed and Sealed this

Twenty-eighth Day of September, 2004

JON W. DUDAS
*Director of the United States Patent and Trademark Office*